(12) United States Patent
Song et al.

(10) Patent No.: US 7,733,019 B2
(45) Date of Patent: Jun. 8, 2010

(54) FLAT PANEL DISPLAY DEVICE WITH A LENS SHEET HAVING CONDENSING LENSES THEREON

(75) Inventors: Seung-Yong Song, Hwaseong-si (KR); Jang-Hyuk Kwon, Suwon-si (KR); Jin-Woo Park, Yongin-si (KR); Dong-Soo Choi, Seoul (KR); Min-Gyu Lee, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 796 days.

(21) Appl. No.: 11/095,621

(22) Filed: Apr. 1, 2005

(65) Prior Publication Data

US 2005/0231085 A1      Oct. 20, 2005

(30) Foreign Application Priority Data

Apr. 19, 2004   (KR) .................... 10-2004-0026644

(51) Int. Cl.
 *H01J 1/62* (2006.01)
(52) U.S. Cl. ................. 313/512; 313/509; 313/587
(58) Field of Classification Search .......... 313/498–512
 See application file for complete search history.

(56) References Cited

U.S. PATENT DOCUMENTS

| | | | |
|---|---|---|---|
| 6,345,903 B1 * | 2/2002 | Koike et al. .................. 362/241 |
| 2002/0039157 A1 * | 4/2002 | Nakanishi et al. ............. 349/95 |
| 2002/0084952 A1 * | 7/2002 | Morley et al. ................. 345/32 |
| 2002/0130990 A1 | 9/2002 | Nakamura |
| 2003/0122480 A1 | 7/2003 | Wei et al. |
| 2004/0041164 A1 | 3/2004 | Thibeault et al. |
| 2005/0082972 A1 * | 4/2005 | Chen et al. ................... 313/512 |

FOREIGN PATENT DOCUMENTS

| | | |
|---|---|---|
| DE | 196 23 881 | 12/1997 |
| JP | 04-071189 | 3/1992 |
| JP | 04-192290 | 7/1992 |

(Continued)

OTHER PUBLICATIONS

Korean Office Action of the Korean Patent Application No. 10-2004-0026644, mailed on Jan. 18, 2006.

(Continued)

*Primary Examiner*—Bumsuk Won
(74) *Attorney, Agent, or Firm*—Robert E. Bushnell, Esq.

(57) ABSTRACT

A flat panel display device. The device includes a plurality of self-luminant devices, each of which includes at least a light emitting layer, formed on every pixel, and a lens sheet having a plurality of condensing lenses that correspond to the self-luminant devices and direct the light emitted from the self-luminant devices toward a predetermined direction. A distance between the light emitting layer and an exterior portion of the condensing lens in the direction of propagation of the light is between 50 and 500 microns so as not to overlap images of neighboring sub-pixels, that are expanded by the condensing lenses. Therefore, a lowering of image sharpness that is caused by the condensing lenses can be prevented, while a light coupling efficiency and a brightness are improved.

17 Claims, 9 Drawing Sheets

FOREIGN PATENT DOCUMENTS

| | | |
|---|---|---|
| JP | 07-037688 | 2/1995 |
| JP | 09-045477 | 2/1997 |
| JP | 10-172756 | 6/1998 |
| JP | 10-223367 | 8/1998 |
| JP | 11-074072 | 3/1999 |
| JP | 2000-077188 | 3/2000 |
| JP | 2000-284268 | 10/2000 |
| JP | 2001-265240 | 9/2001 |
| JP | 2002-260845 | 9/2002 |
| JP | 2003-031353 | 1/2003 |
| JP | 2003-036974 | 2/2003 |
| JP | 2003-291406 | 10/2003 |
| JP | 2004-039500 | 2/2004 |
| JP | 2004-046092 | 2/2004 |
| JP | 2004-071246 | 3/2004 |
| JP | 2004-103507 | 4/2004 |
| JP | 2004-127662 | 4/2004 |

OTHER PUBLICATIONS

European Office Action of the European Patent Application No. 05 10 3083, mailed on Oct. 12, 2005.

*Office action* from the Japanese Patent Office issued in Applicant's corresponding Japanese Patent Application No. 2005-020337 dated May 13, 2008.

*Office action* from the Chinese Patent Office issued in Applicant's corresponding Chinese Patent Application No. 2005100672067 dated May 16, 2008.

Office action from Japanese Patent Office issued in Applicant's corresponding Japanese Patent Application No. 2005-020337 dated Jan. 24, 2010, and Request for Entry of the Accompanying Office Action for the Japanese Office action attached herewith.

* cited by examiner

FLAT PANEL DISPLAY DEVICE WITH A LENS SHEET HAVING CONDENSING LENSES THEREON

CLAIM OF PRIORITY

This application makes reference to, incorporates the same herein, and claims all benefits accruing under 35 U.S.C. §119 from an application for FLAT PANEL DISPLAY DEVICE earlier filed in the Korean Intellectual Property Office on 19 Apr. 2004 and there duly assigned Serial No. 2004-26644.

BACKGROUND OF THE INVENTION

1. Field of the Invention

The present invention relates to a flat panel display device, and more particularly, to a flat panel display device having improving a light coupling efficiency from a self-luminant device without sacrificing image sharpness.

2. Description of the Related Art

In general, a light coupling efficiency of a flat panel display using a self-luminant device is determined by refractive indices of layers from the light emitting layer to the outside of the flat panel display. One portion of the display that lowers the light coupling efficiency is at the interface of a transparent substrate having high refractive index and air having low refractive index. At such an interface, total reflection can occur when the incident angle of light is greater than the critical angle, thus lowering the light coupling efficiency.

In the conventional flat panel display having the self-luminant device, the light coupling efficiency of light emitted from the self-luminant device to air via the substrate is based on an equation $(N_{out}/N_{in})^2/2$. In the above equation, N denotes the refractive index.

When the light coupling efficiency in a state in which a glass substrate is used in the above equation, the refractive index $N_{in}$ of the glass substrate is about 1.52 and the refractive index of the air $N_{out}$ is about 1.00, and the light coupling efficiency is about 21.64%. That is, more than 70% of light incident on the substrate is extinguished in the substrate.

In addition, because the light emitted by the self-luminant device is emitted in all directions, there are some solutions for solving the above problem. For example, if a supplied voltage is rises, the brightness can be improved, however, a capacity of a battery must be increased, resulting in an increased weight of the device and reduced life span of the battery and the self-luminant device. Therefore, there are some suggested technologies for reducing the supplied voltage and improving the brightness.

Japanese Laid-open Patent No. hei 4-192290 discloses an electroluminescence (EL) device including a plurality of micro lenses for condensing the light, each of which has a size that is equal to that of a pixel or larger and formed on an exterior surface of a light-transmittable substrate on which the inorganic EL device is formed. The light that is incident onto an interface between the light-transmittable substrate and the air at a critical angle or larger has an incident angle that is less than the critical angle in the micro-lens to reduce the total reflection, and an emitting direction of the light is directed to a predetermined direction to increase the brightness in that direction. However, according to the above invention, since the EL device is a surface source, diffused EL light is generated inevitably when the micro-lens has a size equal to or larger than the size of the pixel. In addition, images are overlapped due to adjacent EL devices, thus the sharpness of the image is degraded.

Japanese Laid-open Patent No. hei 7-037688 discloses an EL device that is formed on a substrate having a high refractive portion that is made of a material having higher refractive index than that of surrounding material in a thickness direction thereof. The light of the EL device transmits the high refractive portion and is emitted, in order to increase the light coupling efficiency. However, in this invention, since the EL light transmitting through the high refractive portion is the diffused light as shown in FIG. 1 of the invention, the brightness is not greatly improved.

Japanese Laid-open Patent No. hei 10-172756 discloses an organic EL device in which one or a plurality of condensing lenses are formed between a lower electrode and an exterior surface of a light-transmittable substrate that forms an organic EL device, and the organic EL device corresponds to the condensing lenses. The light of the EL device transmitting the condensing lens is incident into the interface between the substrate and the air at the critical angle or lower, in order to increase the light coupling efficiency. However, according to that invention, images are overlapped with those of adjacent EL devices, thus degrading the sharpness of the image.

SUMMARY OF THE INVENTION

It is therefore an object of the present invention to provide an improved design for a flat panel display.

It is also an object of the present invention to provide a flat panel display device that increases the light coupling efficiency and the brightness, without sacrificing image sharpness.

These and other objects can be achieved by a flat panel display device that includes a plurality of self-luminant devices, each of which includes at least a light emitting layer formed on every pixel, and a lens sheet having a plurality of condensing lenses that corresponds to the self-luminant devices and directs the light emitted from the self-luminant devices toward a predetermined direction, the distance from the light emitting layer to an exterior portion of the condensing lens in the direction of propagation of the light being controlled so as to prevent the overlapping of images from neighboring sub-pixels, which are expanded by the condensing lenses. The distance between the light emitting layer and the exterior portion of the condensing lens in the direction of propagation of the light being 500 μm or smaller. The distance between the light emitting layer and the exterior portion of the condensing lens in the direction of propagation of the light may be about 50 μm or larger.

The self-luminant devices may be formed on a surface of the substrate, a sealing substrate for sealing the self-luminant devices may be formed, and the lens sheet may be formed on the other surface of the substrate or an exterior surface of the sealing substrate. The lens sheet and the substrate or the lens sheet and the sealing substrate may be formed integrally with each other.

The self-luminant devices may be formed on a surface of the substrate, a sealing substrate for sealing the self-luminant devices may be formed, and the lens sheet may be formed between the self-luminant devices and the substrate or between the self-luminant devices and the sealing substrate.

The condensing lenses may be formed in the substrate or in the sealing substrate. The condensing lenses may correspond to the self-luminant devices one to one. The condensing lenses may be convex lenses. The self-luminant devices may be organic electroluminescence devices.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
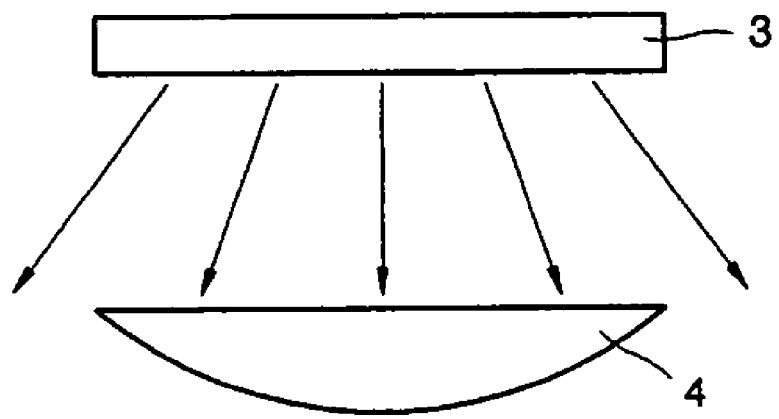
FIGS. 1 and 2 are conceptual views illustrating how light is controlled based on a distance between where the light is generated and a lens.
Figure 2:
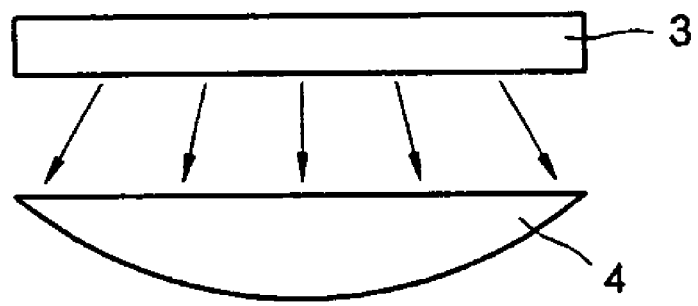

Turning now to the figures, FIGS. 1 and 2 are conceptional views illustrating a difference of intensities of lights that pass through a condensing lens 4 according to a distance between a light emitting layer 3 of a self-luminant device to an exterior portion of the condensing lens 4 in a light path direction. The self-luminant device, especially, an electroluminescence (EL) device emits diffused light, thus the light intensity directed to a predetermined direction through the condensing lens 4 is reduced when the distance between the light emitting layer 3 and the exterior portion of the condensing lens 4 in the direction of propagation of the light is large. Therefore, it is important to reduce the distance between the light emitting layer 3 and the exterior portion of the condensing lens 4 in the direction of propagation of the light (i.e., the direction in which the light ray travels) in order to improve brightness in a display.

In addition, when the distance between the light emitting layer 3 to the exterior portion of the condensing lens 4 in the direction of propagation of the light is large, effective pixel sizes increase when they are seen from outside through the condensing lens 4. Then, the effective sizes of the pixels increase, and images are overlapped with those of neighboring pixels, thus degrading sharpness of the images. Therefore, it is important to reduce the distance between the light emitting layer 3 and the exterior portion of the condensing lens 4 in the direction of propagation of the light in order to prevent the images of neighboring pixels from overlapping.

Figure 3:
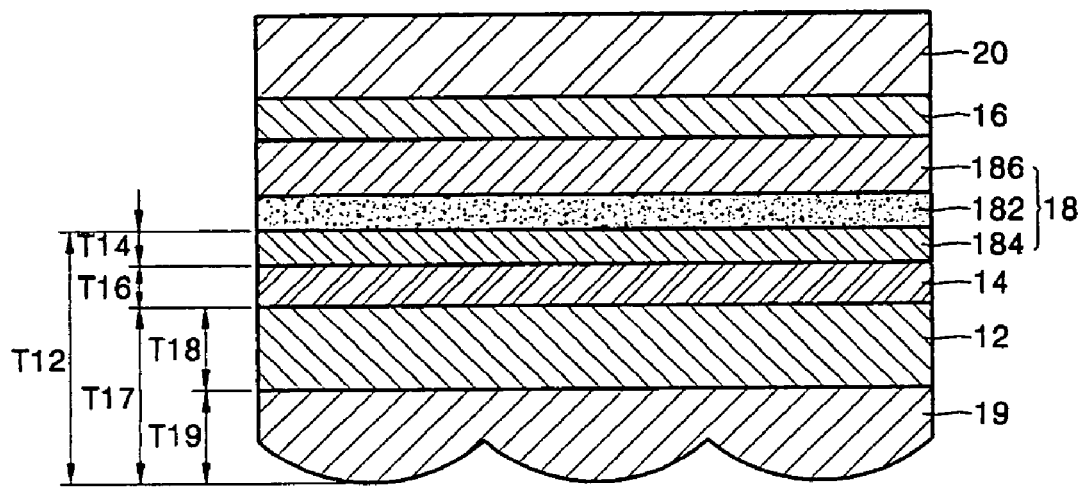
FIG. 3 is a schematic cross-sectional view illustrating a back emission type flat panel display device having an electroluminescence (EL) self-luminant device according to a first embodiment of the present invention.

Turning now to FIG. 3, FIG. 3 is a schematic cross-sectional view illustrating a back emission type flat panel display device including an EL device as the self-luminant device according to a first embodiment of the present invention. Referring to FIG. 3, the flat panel display device according to the first embodiment of the present invention includes a substrate 12, a first electrode layer 14 formed on a first surface of the substrate 12, an interlayer 18 including a light emitting layer 182 formed on the first electrode layer 14, a second electrode layer 16 having a different polarity from that of the first electrode layer 14 on the interlayer 18, and a lens sheet 19 formed on a second surface of substrate 12. In addition, a sealing member 20 that seals the first electrode layer 14, the interlayer 18, and the second electrode layer 16 from the outside is located on the second electrode layer 16.

A glass substrate made of $SiO_2$ can be used as the substrate 12. Although it is not illustrated in FIG. 3, the substrate 12 may further include a buffer layer for planarizing the substrate and preventing infiltration of impurities, and the buffer layer can be made of $SiO_2$. In addition, the substrate 12 can be made of a plastic material, as well as the glass material, and can be made of a polymer based flexible type material.

The first electrode layer 14 that is stacked on the substrate 12 can be made of a transparent conductive material, for example, an indium-tin-oxide (ITO), and can be formed to be a predetermined pattern by a photolithography method. The pattern of the first electrode layer 14 can be stripes, which are separated from each other with predetermined intervals, in a case of passive matrix (PM) type, or can be formed to correspond to the pixels in a case of active matrix (AM) type. In addition, in a case where the electrode is the AM type, a small film transistor (TFT) layer including at least one TFT can be further located between the first electrode layer 14 and the substrate 12, and the first electrode layer 14 is electrically connected to the TFT. The above described feature is applied to all embodiments of the present invention that will be described later. The first electrode layer 14 made of the ITO can function as an anode by being connected to an outer first electrode terminal (not illustrated).

The second electrode layer 16 is placed over the first electrode layer 14. The second electrode layer 16 can be a reflective electrode in the case where the self-luminant device is a back emission EL device, made of aluminium/calcium, and can function as a cathode by being connected to an outer second electrode terminal (not illustrated). In a case where the second electrode layer 16 is PM type, it can be formed as stripes crossing the pattern of the first electrode layer 14, and in a case where the second electrode layer 16 is the AM type, it can be formed on an entire active area on which images are displayed. The first electrode layer 14 and the second electrode layer 16 can have opposite polarities.

The interlayer 18 located between the first electrode layer 14 and the second electrode layer 16 includes the light emitting layer 182 that emits light by electric operations of the first and second electrode layers 14 and 16. The EL device can be classified into an organic EL device or an inorganic EL device according to the interlayer 18. If the EL device is an organic EL device, a low molecular organic material or a high molecular organic material can be used.

If the interlayer 18 is a low molecular organic layer made of the low molecular organic material, the interlayer 18 can include a first interlayer 184 including a hole transport layer (HTL) and a hole injection layer (HIL) in the direction of the first electrode layer 14 from the light emitting layer 182, and a second interlayer 186 including an electron transport layer and an electron injection layer (HIL) in the direction of the second electrode layer 16 from the light emitting layer 182. The hole injection layer, the hole transport layer, the electron transport layer, and the electron injection layer can be formed in various structures, and other layers performing different functions can be formed.

In addition, the organic material can be copper phthalocyanine (CuPc), N,N-di(naphthalene-1-yl)-N,N'-diphenyl-benzidine (NPB), or tris-8-hydroxyquinoline aluminum (Alq3). The interlayer 18 can have the light emitting layer 182 of various patterns so as to correspond to colors of the pixels, in a case where the device is a full-color organic EL device. The low molecular organic layer can be formed in a way that the organic material is heated and deposited in a vacuum atmosphere, and the light emitting layer 182 can be formed by depositing respective colors using a mask, on which slits of predetermined pattern are formed, so as to correspond to the pixels.

On the other hand, in a case of the high molecular organic layer made of the high molecular organic material, the HTL can be formed as the first interlayer 184 in the direction of the first electrode layer 14 from the light emitting layer 182, and the second interlayer 186 can be omitted. The high molecular HTL can be formed on the first electrode layer 14 of the transparent substrate 12 by an inkjet printing method or a spin coating method using poly-(2,4)-ethylene-dihydroxy thiophene (PEDOT) or polyaniline (PANI). The high molecular organic light emitting layer can be made of PPV, soluble PPV, cyano-PPV, or polyfluorene, and can be formed in an inkjet printing method, a spin coating method, or a thermal transfer method using laser. The structures of the first and second interlayers 184 and 186 are not limited thereto, but can be formed in various forms.

In the case of the inorganic EL device, the light emitting layer 182 is made of emitting atoms, for example, metal sulphide such as ZnS, SrS, and CaS or alkaline-earth potassium sulphide such as $GaGa_2S_4$ and $SrGa_2S_4$, and transition metal or alkaline-earth metal including Mn, Ce, Tb, Eu, Tm, Er, Pr, and Pb. In addition, the first and second interlayers 184 and 186 can be formed as insulating layers.

Hereinafter, the present invention will be described based on the low molecular organic EL device. A sealing member 20 is located on the second electrode layer 16, and the sealing member 20 can be a metal cap including a desiccant therein. Otherwise, a resin material for sealing can be applied on the second electrode layer 16 so as to prevent humidity from infiltrating. The sealing member 20 can be formed using the substrate.

According to the flat panel display device of the first embodiment of the present invention, the self-luminant device is the EL device, and the light emitted from the light emitting layer 182 propagates toward the substrate 12 for the back emission type. However, the emission type is not limited thereto, and the device can be the front emission type or dual emission type, and the self-luminant device does not have to be an EL device.

In the first embodiment of the present invention, a lens sheet 19 having condensing lenses is formed on the second surface of the substrate 12, and the lens sheet 19 can be made of a glass material having $SiO_2$ or an epoxy based plastic material. In a case where the epoxy based plastic is used as the lens sheet 19, the refractive index thereof is similar to that of glass, which is the material of the substrate 12, and an epoxy based material is also used as an adhesive to attach the lens sheet 19 to the substrate 12, thus reducing the total reflection and improving the light coupling efficiency.

In the flat panel display device of the first embodiment as described above, a distance T12 from the light emitting layer 182 to the exterior portion of the lens sheet 19 in the direction of propagation of the light is controlled, and it is desirable that the distance T12 is controlled to be small enough so that the sharpness of the image is improved and the light coupling efficiency is increased when the distance T12 is small.

The distance T12 includes the thickness of the first interlayer 184 (T14), the thickness of the first electrode layer 14 (T16), the thickness of the substrate 12 (T18), and the thickness of the lens sheet 19 (T19). The thicknesses of the first interlayer 184 and the first electrode layer 14 are 1 μm or less, and the thickness T18 of the substrate 12 is hundreds of μm, thus it is important to control the thickness T18 of the substrate 12. Here, since the substrate 12 can be cambered easily when the thickness T18 of the substrate 12 is small, the thickness T18 of the substrate 12 can be controlled to be small by etching the substrate 12.

Figure 4:
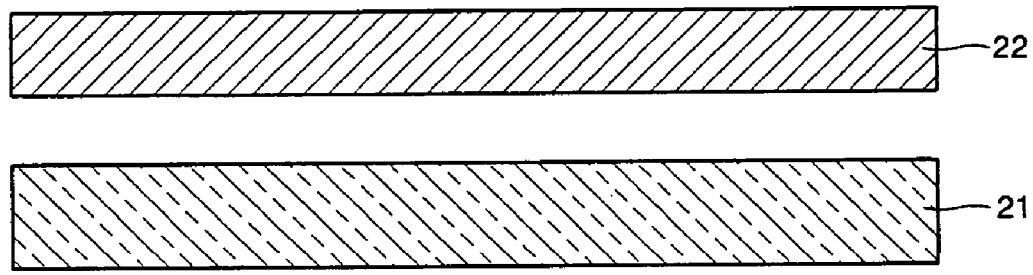
FIGS. 4 through 9 are cross-sectional views illustrating processes of fabricating a flat panel display device.

Turning now to FIGS. 4 through 9, FIGS. 4 through 9 are cross-sectional views illustrating the method of manufacturing the flat panel display device having small substrate. Referring to FIG. 4, an upper substrate 21 and a lower substrate 22, which have relatively large thickness to prevent the pattern from being distorted when an image is formed by an image displaying unit, are positioned. In the above process, the upper and the lower substrates 21 and 22 are made of a glass material that can be etched, however, the substrates 21 and 22 can be made of other materials that can be chemically or physically etched and have insulating characteristics.

Figure 5:
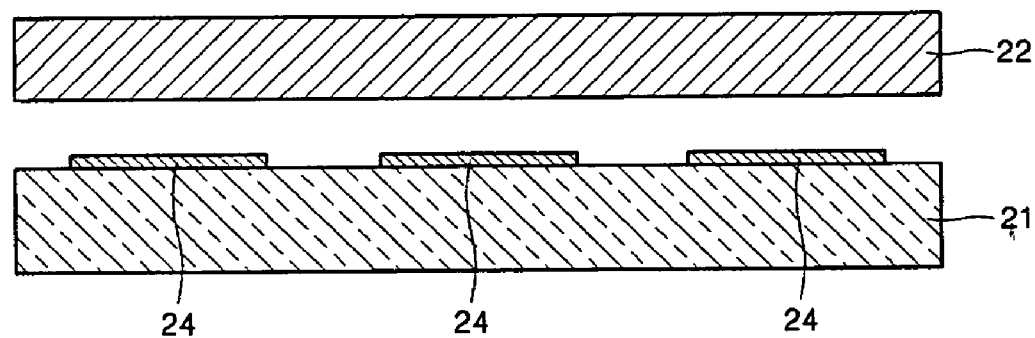

When the upper and lower substrates 21 and 22 are completed, image display units 24 are formed at least on one surface between the facing surfaces as illustrated in FIG. 5. The image display units 24 are separated from each other at predetermined intervals so as to construct a single image display apparatus when they are separated, and can be formed on the facing surfaces of the upper and lower substrates 21 and 22 that face each other.

Figure 6:
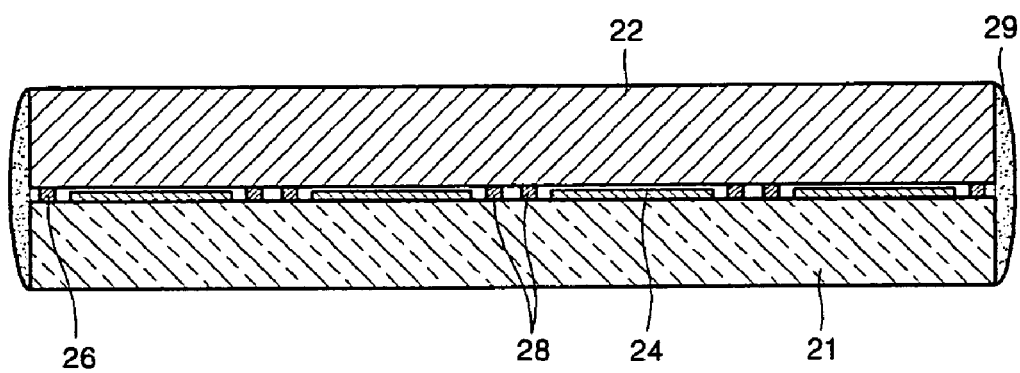
Figure 7:
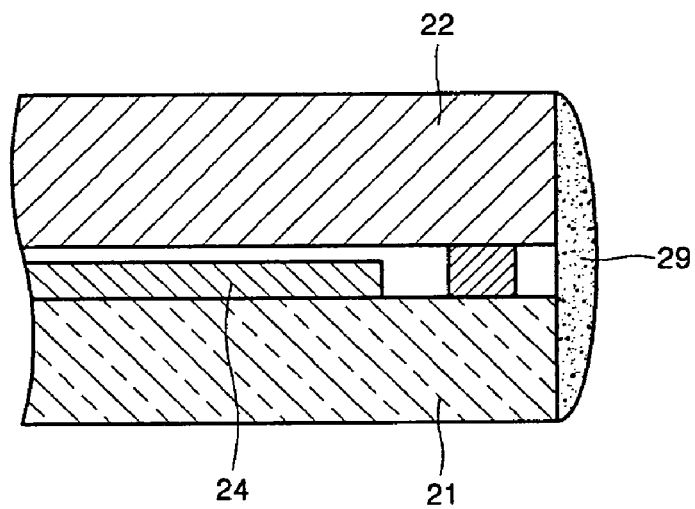

When the making of the image display units 24 is completed, the upper and lower substrates 21 and 22 are sealed together as illustrated in FIG. 6. A first sealing material 26 is applied along the edges of the upper and lower substrates 21 and 22 facing each other, and a second sealing material 28 is applied around each image display unit 24 to define the image display units 24, then the upper and lower substrates 21 and 22 are aligned to be sealed with each other. Here, the first sealing material 26, formed on the edges of the upper and lower substrates 21 and 22, is applied on the outermost portions of the upper and lower substrates 21 and 22 to seal the substrates 21 and 22 together in order to protect the image display units 24 from an etchant. In addition, in order to prevent the side surfaces of the upper and lower substrates 21 and 22 from being etched by the etchant, a protective layer 29 can be further formed on side portions of the upper and lower substrates 21 and 22 that are sealed by the first sealing material 26.

Figure 8:
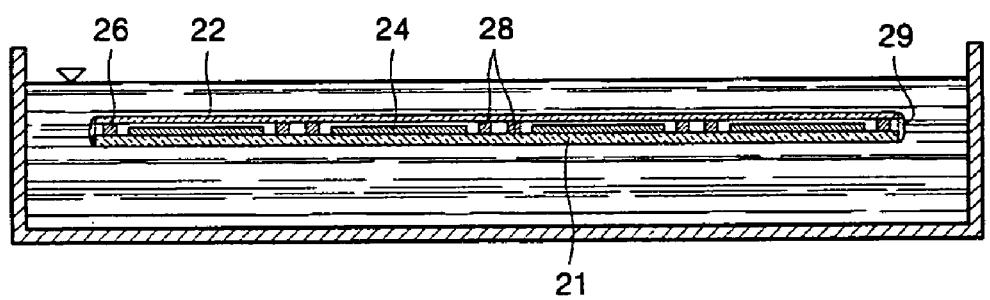

When the sealing of the upper and lower substrates 21 and 22 is completed, the sealed upper and lower substrates 21 and 22 are etched to desired thicknesses. The etching of the upper and lower substrates 21 and 22 can be performed by a physical etching method or a chemical etching method as illustrated in FIG. 8. Hydrofluoric acid or a hydrochloric acid can be used as the etchant in the chemical etching method. The thicknesses of the upper and lower substrates 21 and 22 can be different from each other at the initial stage to vary the thicknesses after performing the etching process. The thickness is preferably 100 μm or smaller. On the other hand, in a case where a flat panel display device having a large screen is manufactured, one image display unit can be formed on the substrates 21 and 22, the upper and lower substrates 21 and 22 are sealed as described above, and then etched.

Figure 9:
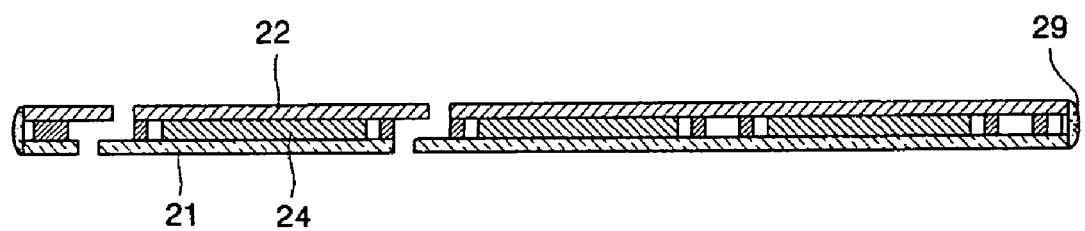

When the etching of the upper and lower substrates 21 and 22 is completed, the sealed substrate is cut so that the cut portion includes one image display unit 24 as illustrated in FIG. 9. The upper and lower substrates 21 and 22 can be cut by a thermal shock of a laser beam.

According to the method of manufacturing the EL display apparatus, the image display units are formed on the substrates, the upper and lower substrates 21 and 22 are sealed and etched to fabricate the small image display apparatus. Thus, the processes of manufacturing the small display apparatus can be simplified, and defects caused by the image display units formed on the substrate can be reduced.

When the lens sheet is attached to the substrate that is small, the flat panel display device that has the distance of at least 50 μm from the light emitting layer to the exterior portion of the condensing lens in the direction of propagation of the light can be manufactured without lowering the yield greatly. However, it is difficult to manufacture the flat panel display device having the distance less than 500 μm according to the above processes. In addition, the images can be illustrated clearly until when the distance from the emitting layer to the exterior portion of the condensing lens is about 500 μm, however, if the distance is larger than 500 μm, the image sharpness deteriorates and the light coupling efficiency and the brightness are little improved over when the lens sheet is not applied to the device. Therefore, it is desirable that the distance is in a range of 50 μm to 500 μm. When the lens sheet is attached to the substrate in the above conditions, the light coupling efficiency and the brightness in a predetermined direction can be improved without sacrificing image sharpness.

Figure 10:
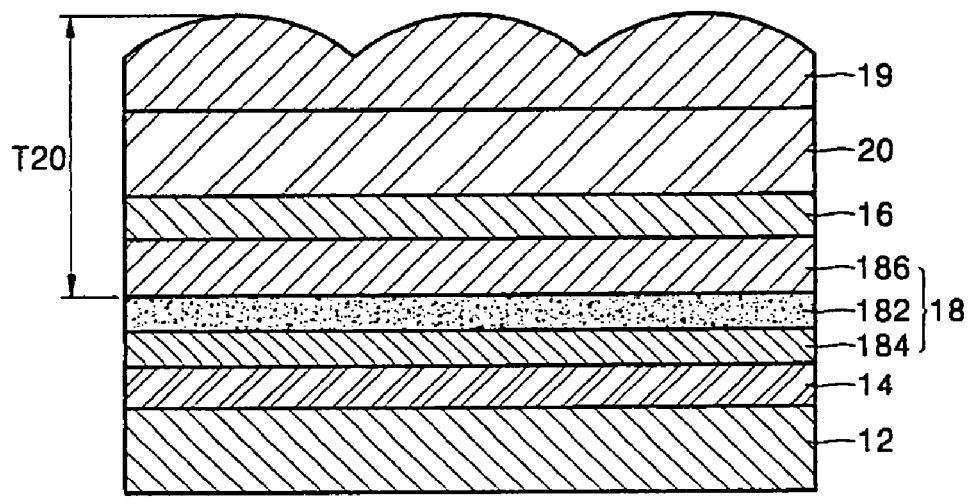
FIG. 10 is a cross-sectional view illustrating a flat panel display device using an EL device that is a front emission type according to the first embodiment of the present invention.
Figure 11:
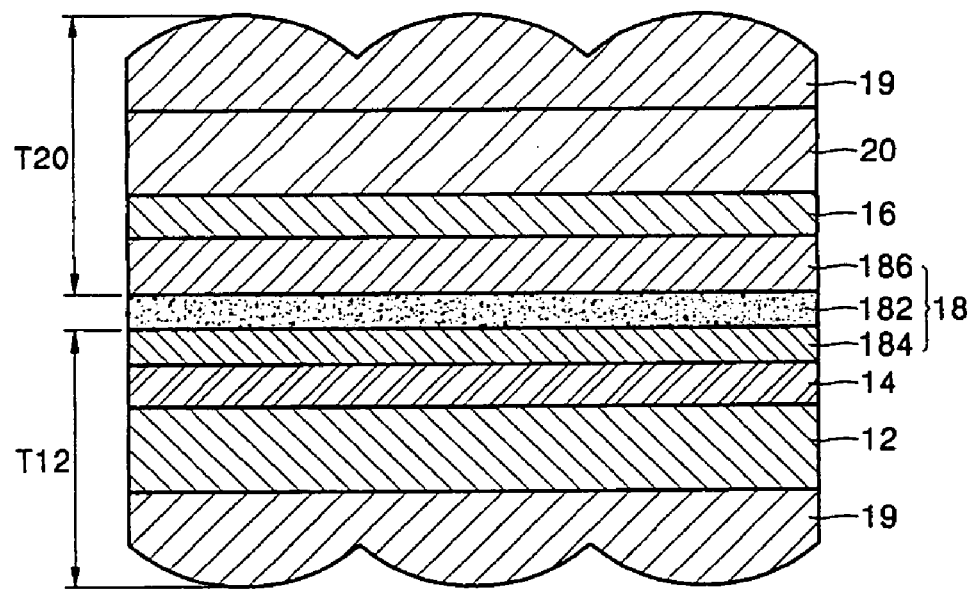
FIG. 11 is a cross-sectional view illustrating a flat panel display device using an EL device of dual emission type according to the first embodiment of the present invention.

Turning now to FIGS. 10 and 11, FIGS. 10 and 11 are cross-sectional views illustrating the flat panel display devices using front emission type and dual emission type EL devices, respectively. If the distances T12 and T20 from the light emitting layer to the exterior portion of the condensing lens are set to be in the range of 50 μm~500 μm, the light coupling efficiency and the brightness can be improved and the sharpness of the image is not sacrificed by attaching the lens sheet.

Figure 12:
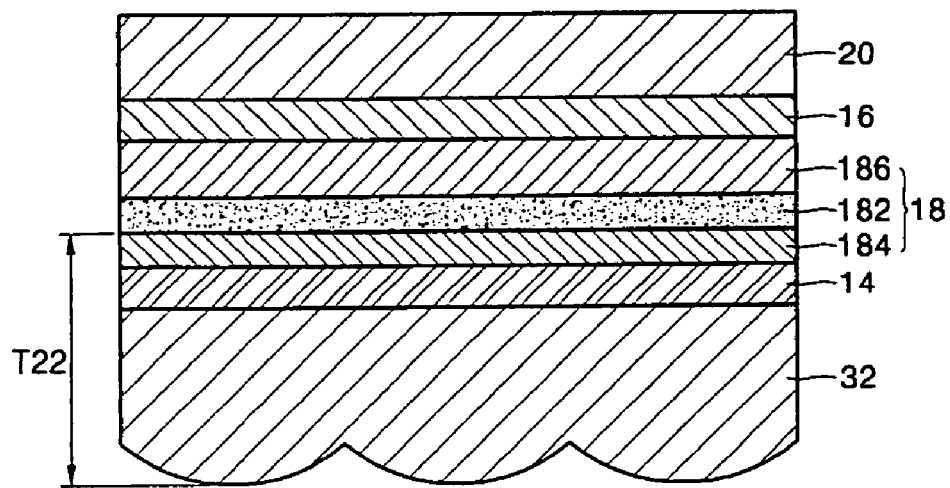
FIG. 12 is a cross-sectional view illustrating a flat panel display device according to a second embodiment of the present invention where a lens sheet and a substrate that are formed integrally with each other, and where an EL device is used as a self-luminant device.

FIG. 12 is a cross-sectional view illustrating the flat panel display device according to the second embodiment of the present invention. In FIG. 12, the flat panel display device is a self-luminant device that is an EL device having a lens sheet and a substrate 32 formed integrally with each other.

If the transparent electrode is directly formed on the lens sheet and it is used as the substrate of the self-luminant device, the lens sheet and the substrates can be formed integrally with each other, the number of elements is reduced, and the process of manufacturing the device can be simplified. In addition, the distance T22 from the light emitting layer to the exterior portion of the condensing lens in the direction of propagation of the light can be set to be in the range of 50 μm~500 μm in order to prevent the sharpness of the image from being sacrificed. The flat panel display device of front emission type or dual emission type, in which the lens sheet and the sealing substrate are formed integrally with each other, can also be manufactured.

Figure 13:
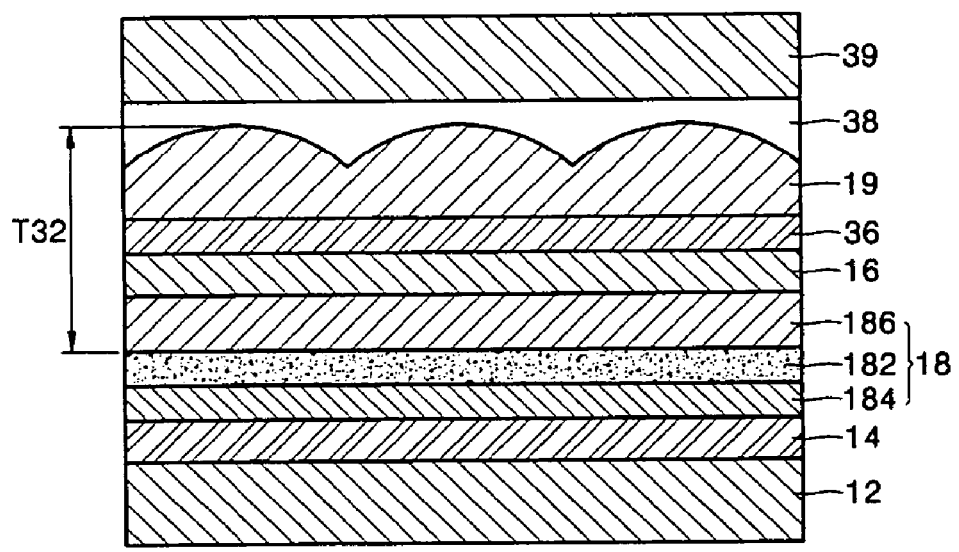
FIG. 13 is a cross-sectional view illustrating a flat panel display device according to a third embodiment of the present invention using an organic EL device of front emission type as a self-luminant device and including a lens sheet formed between a light emitting layer and a sealing substrate.

FIG. 13 is a cross-sectional view illustrating a flat panel display device according to a third embodiment of the present invention. As illustrated in FIG. 13, the flat panel display device is a self-luminant device of a front emission type organic EL device and the lens sheet 19 is formed between the light emitting layer 182 and a sealing substrate 39.

The organic EL device has a disadvantage of being prone to degradation by exposure to internal elements such as oxygen from the ITO and reaction between light emitting layer and the interlayer and exterior elements such as humidity, oxygen, ultraviolet rays, and fabricating conditions. Especially, the exterior oxygen and humidity severely affect the life span of the device, thus it is important to package the organic EL device well. Therefore, a protective layer 36 can be formed on the second electrode layer 16 of the organic EL device by depositing various kinds of organic and inorganic materials. Referring to FIG. 13, the lens sheet 19 is located between the protective layer 36 and the sealing substrate 39. An epoxy based organic material or an acryl based organic material that is used to form the protective layer 36 can be used as an adhesive.

Since the lens sheet 19 is for condensing the light from the light emitting layer 182, a medium layer 38 between the lens sheet 19 and the sealing substrate 39 should have a lower refractive index than that of the lens sheet 19 in a case where the condensing lens is a convex lens illustrated in FIG. 13. If the condensing lens is a concave lens unlike FIG. 13, the medium layer 38 should have larger refractive index than that of the lens sheet material, so that the light can be condensed to the front side.

In the above case, if the distance T32 from the light emitting layer to the exterior portion of the condensing lens in the direction of propagation of the light is set to be in the range of 50 μm~500 μm, the light coupling efficiency and the brightness can be improved while the sharpness of the image is not sacrificed. In addition, in a case where the device is a back emission type device as well as the front emission type illustrated in FIG. 13, the lens sheet can be located between the first electrode layer and the substrate. The above principles can also be applied to a dual emission type.

Figure 14:
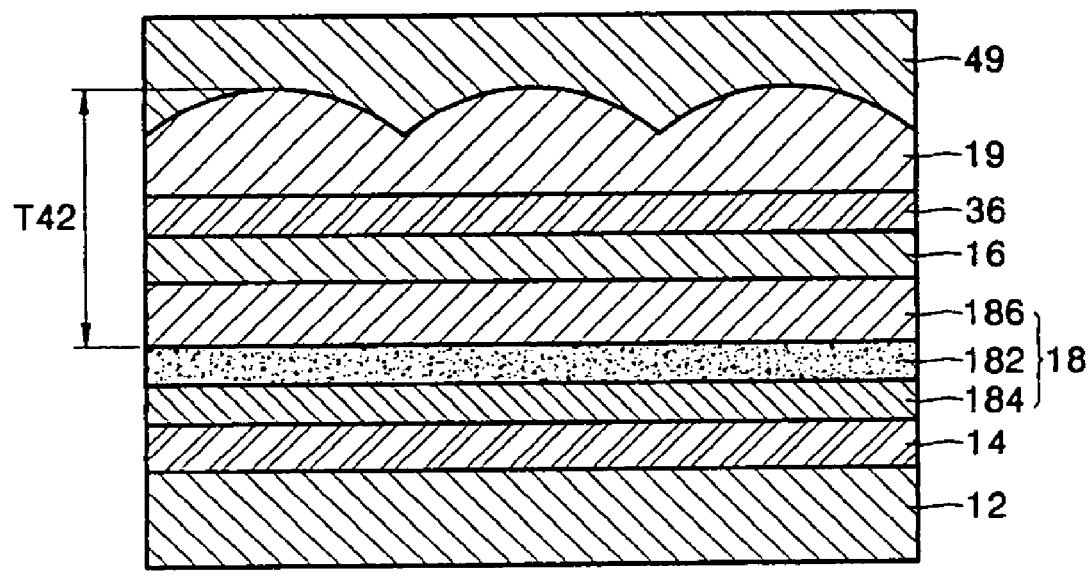
FIG. 14 is a cross-sectional view illustrating a flat panel display device according to fourth embodiment of the present invention using an organic EL device of front emission type as a self-luminant device, and a lens sheet formed between a light emitting layer and a sealing substrate, condensing lenses which are formed in the sealing substrate.

Turning now to FIG. 14, FIG. 14 is a cross-sectional view illustrating a flat panel display device according to a fourth embodiment of the present invention. In FIG. 14, the flat panel display is a self-luminant device that is a front emission type organic EL device, and the lens sheet 19 is formed between the light emitting layer 182 and a sealing substrate 49, and condensing lenses are formed in the sealing substrate 49. In the flat panel display of FIG. 14, in order for the light of the light emitting layer 182 to be condensed by the lens sheet 19, the refractive index of the sealing substrate 49 should be smaller than that of the lens sheet 19 material when the condensing lens is the convex lens as illustrated in FIG. 14.

If the distance T42 from the light emitting layer to the exterior portion of the condensing lens in the direction of propagation of the light is set to be in a range of 50 μm~500 μm, the light coupling efficiency and the brightness can be improved while the sharpness of the image is not sacrificed. In addition, in a case where the device is a back emission type device as well as the front emission type device illustrated in FIG. 14, the lens sheet can be located between the first electrode layer and the substrate, and the condensing lens of the lens sheet can be formed in the substrate, and the above structure can be also applied to the dual emission type device.

Figure 15:
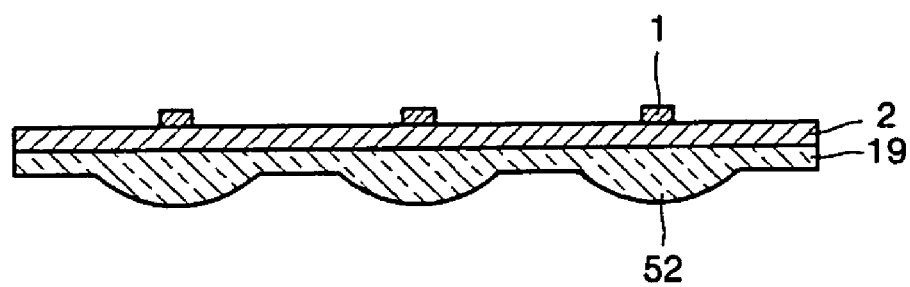
FIG. 15 is a cross-sectional view illustrating a flat panel display device according to a fifth embodiment of the present invention where condensing lenses correspond to self-luminant devices on a one-to-one basis.

Turning now to FIG. 15, FIG. 15 is a cross-sectional view illustrating a flat panel display device according to a fifth embodiment of the present invention. FIG. 15 illustrates the case where the self-luminant devices 1 are arranged on one side of the substrate 2 and the condensing lenses 52 are arranged on the other side of the substrate 2, but the present invention is not limited thereto. As illustrated in FIG. 15, the flat panel display device has condensing lenses 52 that correspond one-to-one with the self-luminant devices 1. Here, one condensing lens 52 only corresponds to one self-luminant device 1, and a center of the condensing lens 52 and a center of the self-luminant device 1 are lined up with each other. When the condensing lenses 52 correspond one-to-one with the self-luminant devices 1, the light of the self-luminant devices 1 can be condensed by the condensing lenses 52 more efficiently.

In the present invention, the condensing lens can be any type of condensing structure that condenses the light, such as the convex lens, the concave lens or a prism. However, if the convex lens is used, the light coupling efficiency and the brightness can be improved more than the case of when concave lenses are used, and the sharpness is sacrificed less than in the case where the prism is used.

In a case where the EL device is used as the self-luminant device, it is preferable that the condensing lens having a plurality of focuses is used since the EL device is a surface source, not a point source. When the condensing lens having a plurality of focuses is used, the light coupling efficiency and the brightness at the front side can be improved more than when the condensing lens having one focus are used.

Figure 16:
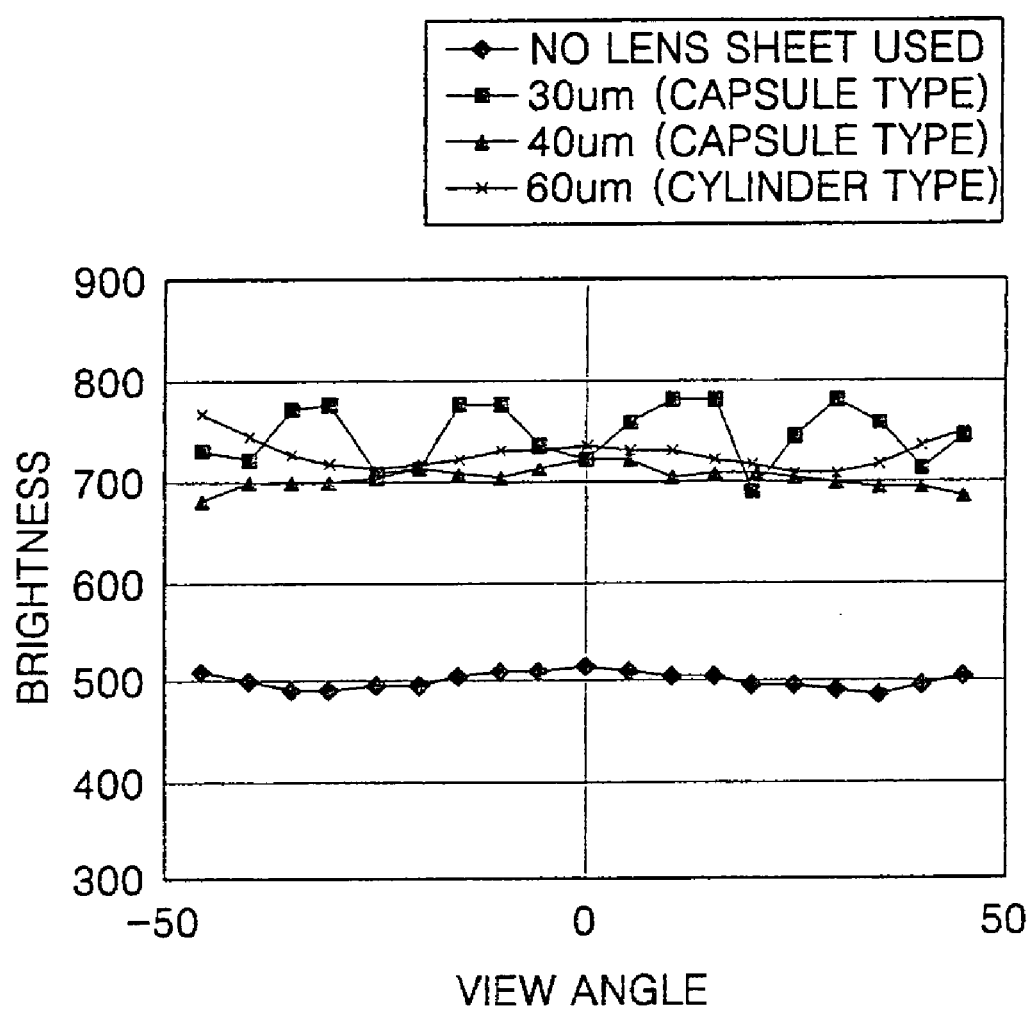
FIG. 16 is a graph illustrating brightness versus view angle for various lens sheets.

Turning now to FIG. 16, FIG. 16 is a graph illustrating results of measuring brightness versus a range of viewing angles from left/right directions based on the front side when the lens sheet is attached and is not attached, and a unit of the brightness is cd/m$^2$. In FIG. 16, reference example (ref.) is the result measured in a case where the lens sheet is not attached to the substrate, and the embodiments are the measurements when curvatures of the condensing lenses are 30 µm, 40 µm, and 60 µm, respectively. When the curvature of the condensing lens is 30 µm or 40 µm, one condensing lens corresponds to one sub-pixel, and when the curvature of the condensing lens is 60 µm, the condensing lens is formed in a stripe shape. As illustrated in FIG. 16, the brightness measured when the lens sheet is attached to the substrate is 1.5 times brighter than that measured when the lens sheet is not attached to the substrate.

Figure 17:
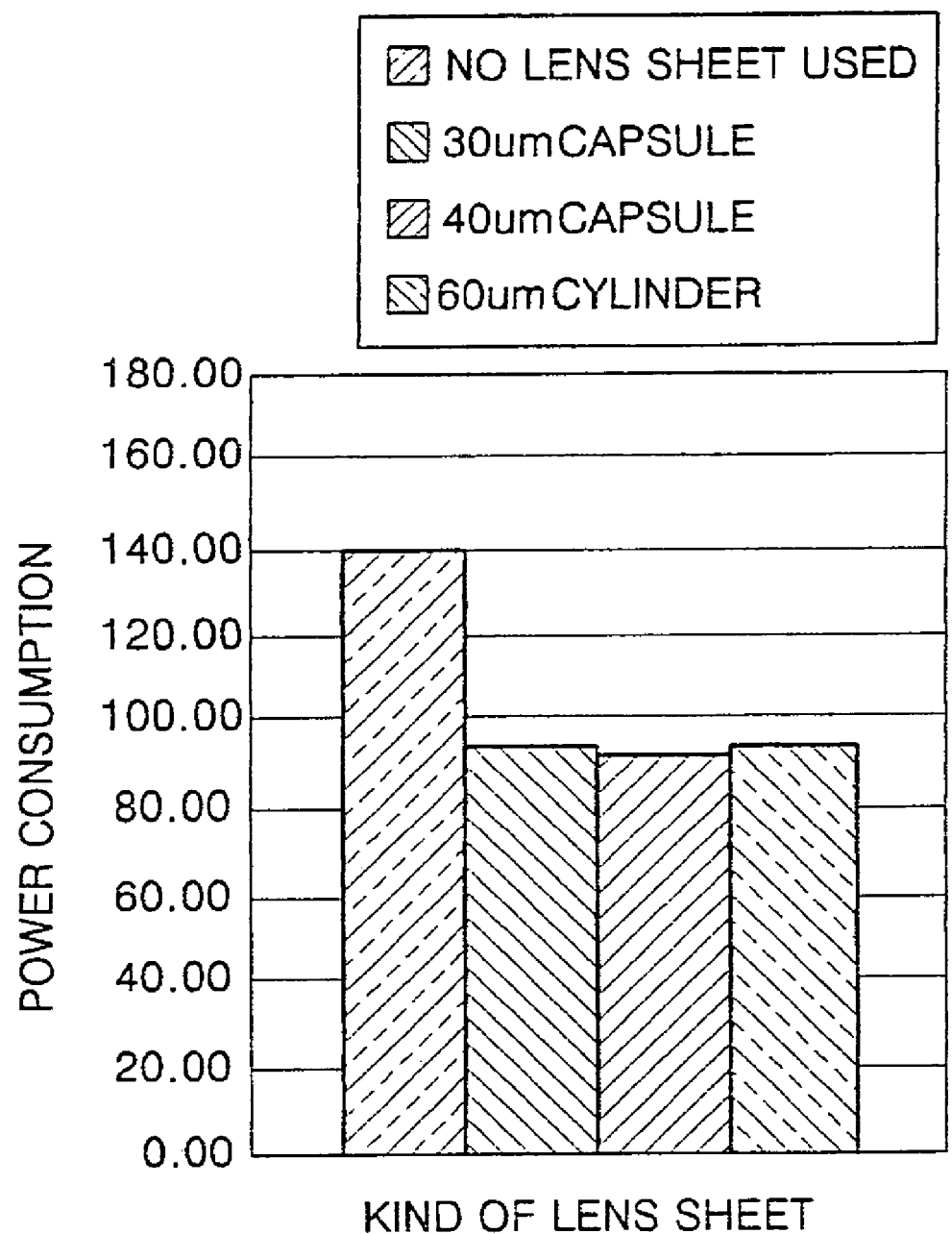
FIG. 17 is a graph illustrating power consumption for various lens sheets.

Turning now to FIG. 17, FIG. 17 is a graph illustrating results of measuring power consumption when the brightness is 250 cd/m$^2$, in cases where the lens sheet is attached and is not attached. The unit of power consumption is mW. As illustrated in FIG. 17, the power consumption when the lens sheet is attached to the substrate is about 66% of that when the lens sheet is not attached, thus the power consumption can be reduced and the life span of the self-luminant device can be increased by attaching the lens sheet.

According to the flat panel display device of the present invention, the distance from the light emitting layer to the exterior portion of the condensing lens in the direction of propagation of the light can be designed to fall within a predetermined range, resulting in improved sharpness of the image that passes through the lens sheet. In addition, the lens sheet is formed on the substrate or on the sealing substrate to reduce the total reflection of light due to the self-luminant device, and to direct the light in a predetermined direction, thus increasing the light coupling efficiency and the brightness. Accordingly, the power consumption of the device can be reduced, and the life span of the self-luminant device can be increased. If the lens sheet and the substrate or the sealing substrate are formed integrally with each other, the number of elements is reduced and processes of manufacturing the device can be simplified. Also, since the lens sheet is formed between the self-luminant device and the substrate or the sealing substrate, the distance from the light emitting layer to the exterior portion of the condensing lens can be reduced.

When the lens sheet is formed between the self-luminant device and the substrate or the sealing substrate and the condensing lenses are formed in the substrate or the sealing substrate, the distance from the light emitting layer to the exterior portion of the lens sheet of the can be reduced and the structure of the flat panel display device can be simplified. In addition, light coupling efficiency can be further improved by forming a one-to-one correspondence between the self-luminant devices and the lenses. When the convex lens is used as the condensing lens, the light coupling efficiency and the brightness can be improved while the sharpness of the image is not sacrificed.

While the present invention has been particularly illustrated and described with reference to exemplary embodiments thereof, it will be understood by those of ordinary skill in the art that various changes in form and details may be made therein without departing from the spirit and scope of the present invention as defined by the following claims.

What is claimed is:

1. A flat panel display device, comprising:
   a plurality of self-luminant devices, each comprising a light emitting layer;
   a lens sheet comprising a plurality of condensing lenses that correspond to the self-luminant devices, the lens sheet adapted to direct light emitted from the self-luminant devices to travel in a predetermined direction, a distance between the light emitting layer and an exterior portion of a corresponding condensing lens in a direction of propagation of the light is set so as not to overlap images of neighboring sub-pixels that are expanded by the condensing lenses;
   a first substrate having the self-luminant devices arranged thereon; and
   a sealing substrate adapted to seal the self-luminant devices, the lens sheet being arranged between either the self-luminant devices and the first substrate or between the self-luminant devices and the sealing substrate, with the condensing lenses being arranged within either the first substrate or the sealing substrate, the condensing lenses being convex and mating with corresponding concave surfaces on the sealing substrate.

2. The device of claim 1, with the distance between each light emitting layer and the exterior portion of a corresponding condensing lens in the direction of propagation of the light being less than 100 µm.

3. The device of claim 2, with the distance between the light emitting layer and the exterior portion of a corresponding condensing lens in the direction of propagation of the light being 50 µm or larger.

4. The device of claim 1, with one of the lens sheet and the substrate and the lens sheet and the sealing substrate are formed integrally with each other.

5. The device of claim 1, with a one-to-one correspondence between the condensing lenses and the self-luminant devices.

6. The device of claim 1, with the condensing lenses being convex lenses.

7. The device of claim 1, with the self-luminant devices being organic electroluminescence devices.

8. The device of claim 1, the lens sheet being arranged between the self-luminant devices and the sealing substrate.

9. The device of claim 1, the sealing substrate being adapted to prevent moisture from reaching the self-luminant devices from an outside.

10. The device of claim 1, the sealing substrate comprising:
a metal cap; and
a desiccant arranged in the metal cap.

11. The device of claim 1, the condensing lenses being arranged within the sealing substrate.

12. The device of claim 1, the lens sheet comprising convex surfaces that mate with and are in contact with corresponding concave surfaces on an inner surface of the sealing substrate.

13. A flat panel display device, comprising:
a lower substrate;
a plurality of self-luminant devices arranged on the lower substrate, each of the self-luminant devices comprise:
a lower electrode layer;
a transparent electrode layer facing the lower electrode layer;
an intermediate layer that includes at least a light emitting layer, the intermediate layer being interposed between the lower electrode layer and the transparent electrode layer;
a lens sheet comprising a plurality of condensing lenses arranged on the transparent electrode layer, with a distance between an exterior side of the lens sheet and a nearest one of said plurality of self luminant devices in a direction of propagation of light emitted from the self-luminant device being between approximately 50 and approximately 500 microns; and
a sealing substrate arranged over the exterior side of the lens sheet, wherein the lens sheet further comprises convex surfaces that mate with and are in contact with corresponding concave surfaces on an inner surface of the sealing substrate.

14. The flat panel display device of claim 13, wherein a refractive index of the sealing substrate is smaller than a refractive index of the lens sheet.

15. A flat panel display device, comprising:
a lower substrate;
a plurality of self-luminant devices arranged on the lower substrate, each of the self-luminant devices comprise:
a lower electrode layer;
a transparent electrode layer facing the lower electrode layer; and
an intermediate layer that includes at least a light emitting layer, the intermediate layer being interposed between the lower electrode layer and the transparent electrode layer;
a lens sheet comprising a plurality of condensing lenses arranged on the transparent electrode layer, with a distance between an exterior side of the lens sheet and a nearest one of said plurality of self luminant devices in a direction of propagation of light emitted from the self-luminant device being between approximately 50 and approximately 500 microns;
a protective layer arranged between the transparent electrode layer and the lens sheet;
a medium layer arranged over the exterior side of the lens sheet; and
a sealing substrate arranged over the medium layer.

16. The flat panel display of claim 15, with the condensing lenses being convex, and with the medium layer having a lower index of refraction than the lens sheet.

17. The device of claim 15, the medium layer comprising concave surfaces that mate with convex surfaces of the condensing lenses of the lens sheet.

* * * * *